United States Patent [19]
Nakayama et al.

[11] Patent Number: 5,231,297
[45] Date of Patent: Jul. 27, 1993

[54] THIN FILM TRANSISTOR

[75] Inventors: Shoichiro Nakayama, Moriguchi; Shigeru Noguchi, Hirakata; Keiichi Sano, Takatsuki; Hiroshi Iwata, Neyagawa; Hiroyuki Kuriyama, Mino, all of Japan

[73] Assignee: Sanyo Electric Co., Ltd., Osaka, Japan

[21] Appl. No.: 818,745

[22] Filed: Jan. 7, 1992

Related U.S. Application Data

[63] Continuation of Ser. No. 552,787, Jul. 12, 1990, abandoned.

[30] Foreign Application Priority Data

Jul. 14, 1989 [JP] Japan ................... 1-183382
Jul. 20, 1989 [JP] Japan ................... 1-187791
Jul. 31, 1989 [JP] Japan ................... 1-198482

[51] Int. Cl.$^5$ ............... H01L 27/01; H01L 27/13; H01L 27/78
[52] U.S. Cl. ........................ 257/77; 257/65; 257/66; 257/192
[58] Field of Search ............ 357/23.7, 2, 59 E, 16, 357/59 B; 257/65, 66, 76, 77, 192; 359/59

[56] References Cited

U.S. PATENT DOCUMENTS

| 4,514,895 | 5/1985 | Nishimura | 357/2 |
| 4,558,340 | 12/1985 | Schachter et al. | 357/23.7 |
| 4,849,797 | 7/1989 | Ukai et al. | 357/2 |
| 4,954,855 | 9/1990 | Mimura et al. | 357/23.7 |
| 4,959,700 | 9/1990 | Yamazaki | 357/23.7 |

OTHER PUBLICATIONS

Laser-Recrystallized Polycrystalline-Silicon Thin--Film Transistors with Low Leakage Current and High Switching Ratio, IEEE Electron Device Letters, vol. EDL-8, No. 9, Sep., 1987, pp. 425–427.

Kruangam et al., "Visible Light a-SIC Multilayered Thin Film LED", Extended Abstracts of the 18th (1986 International) Conference on Solid State Devices and Materials, Tokyo, 1986, pp. 683–686.

Hewig et al., "Optical Properties and Theoretical Model of the Cu$_x$S-CdS Heterojunction", pp. 441–444.

Primary Examiner—Sara W. Crane
Attorney, Agent, or Firm—Darby & Darby

[57] ABSTRACT

A thin film transistor with a noncrystalline semiconductor film, wherein an amorphous semiconductor in a position corresponding to a channel between a source electrode and a drain electrode is polycrystallized, while on both side areas or around the polycrystallized area remains amorphous. The thin film transistor may be a noncrystalline semiconductor film with a heterojunction between a channel area and a source and drain area.

3 Claims, 7 Drawing Sheets

THIN FILM TRANSISTOR

This is a continuation of application Ser. No. 07/552,787, filed Jul. 12, 1990, now abandoned.

BACKGROUND OF THE INVENTION

1. Field of the Invention

The present invention relates to a thin film transistor (hereinafter abbreviated as TFT) with a noncrystalline semiconductor film.

2. Description of Related Art

As substitute for a conventional TFT with a single crystalline semiconductor, there has been developed a TFT with a noncrystalline semiconductor, such as an amorphous semiconductor, a polycrystalline semiconductor, or a mixed crystalline semiconductor of the both.

Among such noncrystalline semiconductors, the most suitable material for forming a lot of TFTs on a large area substrate is amorphous semiconductor material, especially amorphous silicon (hereinafter abbreviated as a-Si) because it has the advantage that its semiconductor properties as a transistor is stable and that it can be formed by plasma CVD (chemical vapor deposition) which is able to form a large area film.

Recently, such an a-Si TFT as mentioned above has been employed and put to practical use for each transistor on a switching transistor array substrate of an active matrix type liquid crystal display unit.

Such a TFT has both advantages that a large area semiconductor film can readily be formed by plasma reaction as mentioned above and that using this plasma reaction enables to continuously form a silicon nitride (SiNx) film or a silicon oxide (SiO$_2$) film which is to be a gate insulating film or a passivation film of a TFT only by changing reaction gases.

However, the electron mobility of such a-Si TFT is merely 0.5 cm$^2$/V.s restricted by the quality of a-Si film, then, enough electric current for driving liquid crystals has not obtained.

In recent years, in order to obtain enough electric current for driving the liquid crystal, a polycrystalline silicon (p-Si) TFT with high electron mobility has been employed, as a result, an active matrix type liquid crystal display unit, which can shorten the switching time of the TFT with higher quality of display, has been put to practical use.

Such a p-Si TFT is manufactured by forming p-Si films by LPCVD method or by recrystallizing the a-Si film later in this process. As for recrystallizing the a-Si film, in addition to heat annealing, there has been developed laser annealing for obtaining a local polycrystalline film by irradiating high energy laser beams.

Where manufacturing the p-Si film of the p-Si TFT by of locally annealing the a-Si film with the laser beams, the p-Si film can be obtained simply by irradiating the laser beams. However, this local annealing results in generating stresses between the p-Si film and another thin film constituting the TFT. As a result, in wet etching, abnormal etching may possibly break a designed pattern of the TFT.

As shown in FIG. 1, in the conventional laser annealing as mentioned above, a great amount of stresses are generated in outline boundaries 19, 19 ... of the pattern between a polycrystalline film 6 and a gate insulating film which is coated over the whole surface of this polycrystalline film 6, as a result, wet etchant which soaks into the outline boundaries should generate inconvenient abnormal overetching. It is considered that the stresses which generally exist in between thin films concentrate on the outline boundaries 19, 19 ... of the pattern.

Though such a polycrystalline silicon TFT can shorten the switching time, there is the disadvantage that the OFF-state current is larger. Then, as a general single crystalline silicon FET, impurities are introduced into a source and drain area to make the conductivity of the source and drain area different from that of a channel area so as to form PN junction between these two areas.

However, this experiment still can not substantially reduce the OFF-state current, then, a practical TFT is not obtained.

The conventional active matrix type liquid crystal display unit, particularly what is called a liquid crystal television set displays images by using the operation of storing electric charge of the liquid crystal, then, the stored electric charge in liquid crystals charged in every frame should be held for a period of displaying one frame. As a result, the holding voltage of the liquid crystals is reduced because of the current leakage during that period which deteriorates the quality of display.

Though a transparent liquid crystal television set with a back light is general, a-Si material constituting the above TFT easily responds to light as is apparent that the material is used for a solar battery, the OFF-state current is increased by irradiation of light (Japanese Patent Application Laid-Open No. 61-145869).

To solve such problem caused by irradiation of light beams, it is proposed to widen the band gap of the a-Si semiconductor film of the TFT or to cover the whole surface of the a-Si semiconductor film with a light-shielding film. However, it is inevitable that the former proposition substantially results in deteriorating the quality of the a-Si semiconductor film and the latter results in lowering the manufacturing yield rate because of an additional process for forming the light-shielding film.

SUMMARY OF THE INVENTION

The foregoing problems are overcome in accordance with the present invention.

It is a first object of the present invention to provide a TFT without over-etching to break a designed pattern of the TFT by preventing abnormal stresses from concentrating on outline portions of a noncrystalline semiconductor film, when an amorphous semiconductor film is polycrystallized by annealing with laser beams, and by preventing etchant from soaking in the outline portions of the film during wet etching.

It is a second object of the present invention to provide a TFT which can restrain an electric current from increasing under light irradiation by making photosensitivity of the area not shielded by a gate electrode lower.

It is a third object of the present invention to provide a TFT which can reduce the OFF-state current to a practical minimum and shorten the switching time, by constructing the hetero junction between a noncrystalline channel area and a source and drain area.

It is a fourth object of the present invention to provide a method for manufacturing TFT which can reduce manufacturing costs by readily forming the hetero junction between the channel area and the source and drain area by laser doping.

The above and further objects and features of the invention will more fully be apparent from the following detailed description with accompanying drawings.

DESCRIPTION OF THE PREFERRED EMBODIMENTS

Now will be described below TFTs in accordance with the present invention with reference to the accompanying drawings.

Figure 2A:
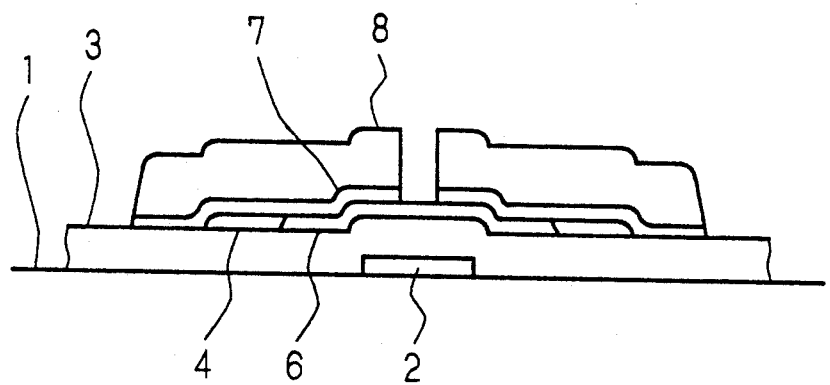
FIGS. 2(a) and 2(b) are sectional and plan views illustrating construction of one embodiment of a TFT of the present invention.
Figure 2B:
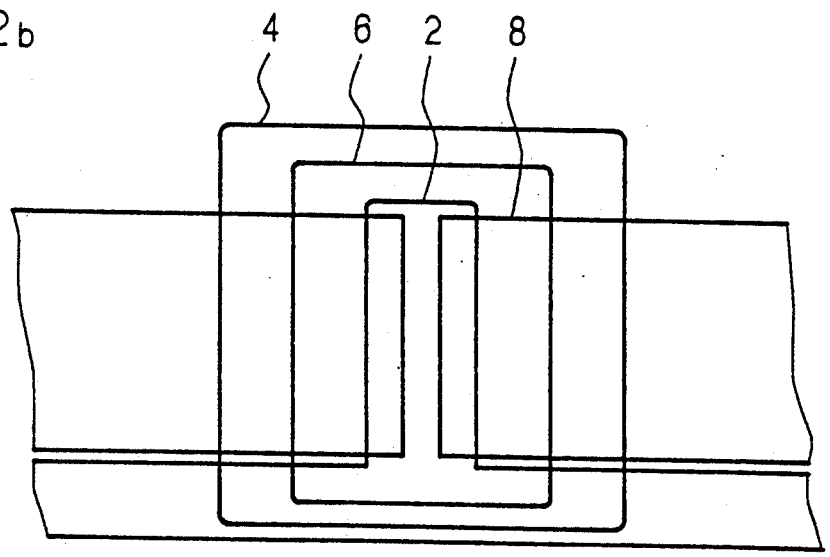

FIG. 2 and FIG. 3 illustrate the first embodiment of the TFT of the present invention. FIG. 2(a) is a sectional view illustrating construction, FIG. 2(b) is a plan view thereof, and FIG. 3(a) through (d) are sectional views illustrating processes for manufacturing the TFT.

As illustrated in FIG. 2, the TFT of the first embodiment of the present invention has the inverted staggered construction laminated with an insulating substrate 1, a gate electrode 2, a gate insulating film 3, an amorphous semiconductor film 4 whose central portion (channel portion) is a polycrystalline semiconductor film 6, an impurities introduced semiconductor film 7, and a source electrode 8 and a drain electrode 8.

Now will be described below in detail the processes for manufacturing the TFT of the first embodiment of the present invention shown in FIG. 2 with reference to FIG. 3.

Figure 3A:
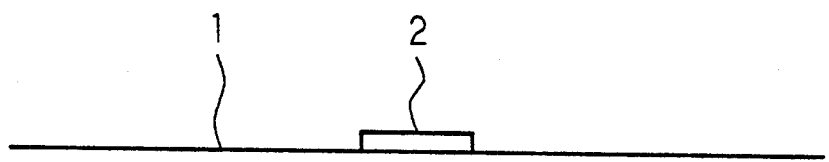
FIGS. 3(a)-3(d) are schematic views illustrating processes for manufacturing this TFT.
Figure 3B:
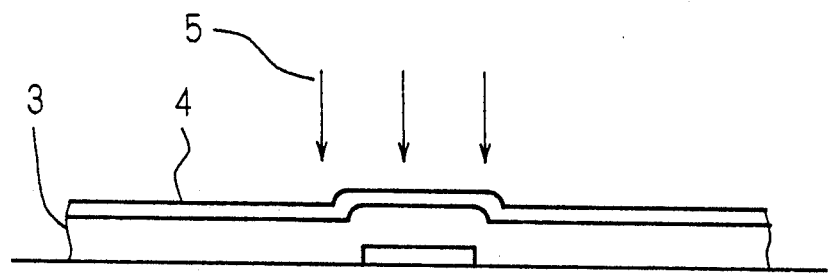

A film of the gate electrode 2 is patterned on the transparent insulating substrate 1 [FIG. 3(a)]. On this gate electrode film 2 are formed the SiNx gate insulating film 3 SiNx first and then the a-Si semiconductor film 4, and the local portion (the channel portion just above the gate electrode film 2) of this amorphous semiconductor film 4 is recrystallized with high energy beams 5 (laser beams, for example) [FIG. 3(b)].

Figure 3C:
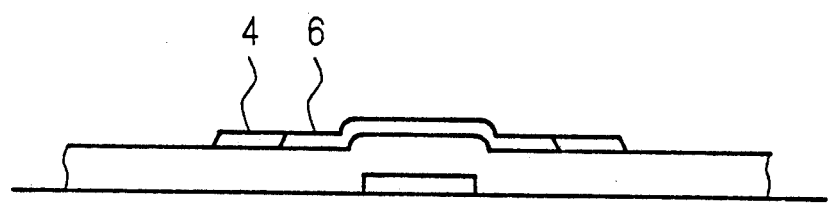
Figure 3D:
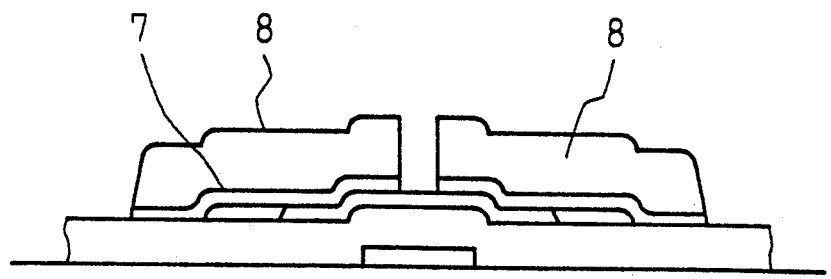

As a result, the polycrystalline semiconductor film 6 composed of p-Si, for example, is obtained which was polycrystallized by laser annealing, and around the polycrystalline semiconductor film 6 remains a-Si film before the laser annealing [FIG. 3(c)].

When employing an XeCl excimer laser beams, as the high energy laser beams, its desirable amount of radiant energy is within 100 to 250 mJ/cm$^2$. The laser beams with the radiant energy within 100 to 250 mJ/cm$^2$ are capable of polycrystallizing an a-Si film to be a p-Si film of 100 Å to 10000 Å whose electron mobility is about 1000 times as large as that of the a-Si film.

Another annealing with hydrogen after the foregoing annealing stabilizes the properties of the semiconductor film 6, which process is not shown in the figure.

On the semiconductor film 6 is formed the impurities introduced semiconductor film 7 of n+ a-Si obtained by introducing phosphorous to a-Si. The source electrode 8 and the drain electrode 8 are formed on the impurities introduced semiconductor film 7 in the final process for manufacturing the TFT [FIG. 3(d)].

Dark conductivity of the intrinsic p-Si film which was polycrystallized by annealing varies from $10^{-4}$ to $10^{-6} \Omega^{-1} \cdot cm^{-1}$, which is much higher than that of the a-Si film (varying from $10^{-8}$ to $10^{-11} \Omega^{-1} \cdot cm^{-1}$.

When doping impurities in an active layer, the typical doping volume is $10^{13}$ to $10^{15}$ cm$^{-3}$.

The grain size of the p-Si film varies from 100 Å to 10000 Å, while there is substantially no grain in the a-Si film.

Figure 1:
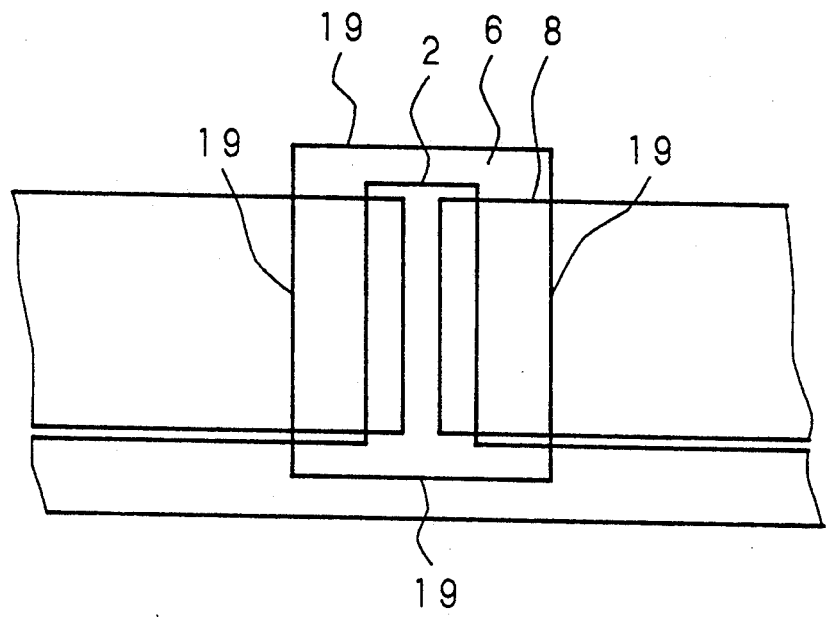
FIG. 1 is a plan view illustrating construction of a conventional TFT.
Figure 4:
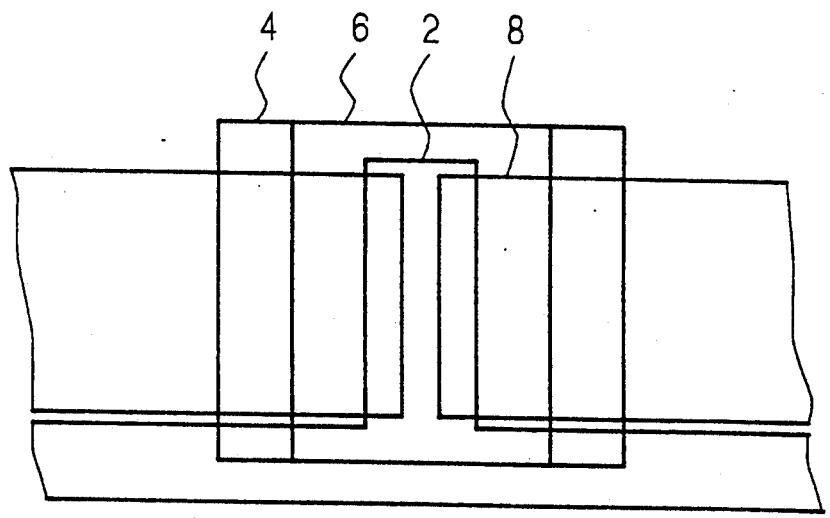
FIG. 4 is a plan view illustrating construction of a modification of the TFT incorporated in FIG. 2.

FIG. 4 is a schematic view illustrating construction of a modification of the first embodiment. In this modification, an amorphous semiconductor film 4 remains not on whole the circumference of a polycrystalline semiconductor film 6 but on the opposite two side portions of the polycrystalline semiconductor film 6 where a source electrode 8 and a drain electrode 8 will be laminated, which prevents distortion in the pattern from adversely affecting the forming of the source electrode 8 and the drain electrode 8. As is clear from the above description, even the amorphous semiconductor film 4 remaining partly beside the polycrystalline semiconductor film 6, has enough effects in definitely patterning the channel length or width of the TFT.

There has been described above on the inverted staggered TFT, where the source electrode film 8 and the drain electrode film 8 are laminated above the gate electrode film 2, however, the present invention may also be applicable to TFTs with other constructions (coplanar type or the like).

In addition, in the above description employed the n+ a-Si film as the impurities doping layer for a contact, however, the impurities doping layer may be formed by direct doping to other polycrystalline films.

Figure 5:
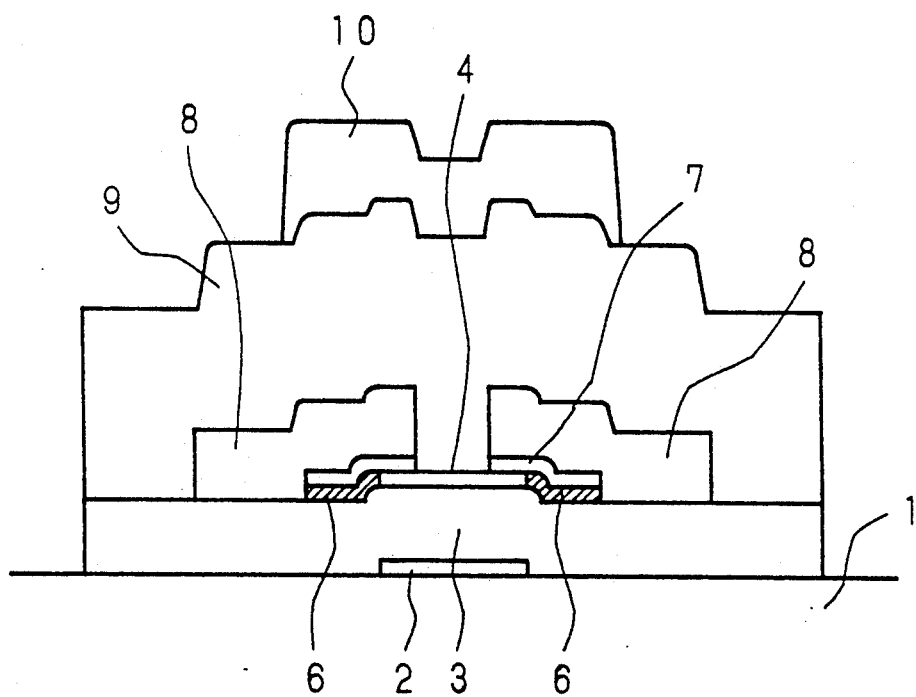
FIG. 5 is a sectional view illustrating construction of another embodiment of the TFT of the present invention.

FIG. 5 is a sectional view illustrating construction of the second embodiment of the TFT of the present invention, and FIG. 6 is a sectional view illustrating processes for manufacturing the TFT.

Reference numerals in FIG. 5 represent the following elements: 1, insulating substrate; 2, gate electrode; 3, gate insulating film; 4, amorphous semiconductor film; 6, polycrystalline semiconductor film; 7, impurities introduced amorphous semiconductor film; 8, 8, drain electrode and source electrode; 9, passivation film; and 10, light-shielding film.

The TFT of the second embodiment is characterized in that the semiconductor film consists of a polycrystalline semiconductor film 6 and an amorphous semiconductor film 4, and the amorphous semiconductor film 4 is provided in the area corresponding to that of the gate electrode 2.

Now will be described below processes for manufacturing this TFT with reference to FIG. 6(a) through (e).

Figure 6A:
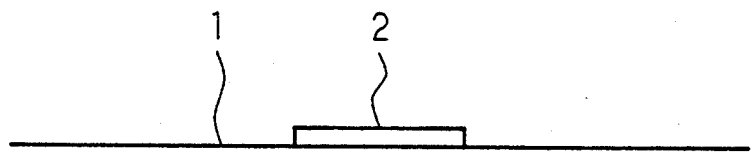
FIGS. 6(a)-6(e) are schematic views illustrating processes for manufacturing the TFT in FIG. 5.

The gate electrode 2 is patterned on the transparent glass substrate 1 [FIG. 6(a)].

Figure 6B:
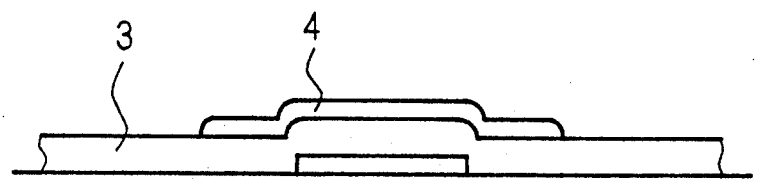
Figure 6C:
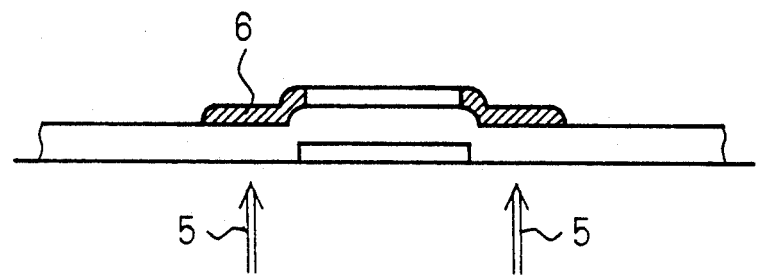

On the gate electrode 2 are formed the gate insulating film 3 composed of SiNx and the amorphous semiconductor film 4 composed of a-Si sequentially, and this amorphous semiconductor film 4 is patterned to form islands [FIG. 6(b)].

And a high energy beams 5, such as laser beams, are irradiated on the amorphous semiconductor film 4 from the side of the transparent substrate 1. At this time, the gate electrode 2 partially masks the amorphous semiconductor film 4, then, the high energy beams 5 are irradiated on only the portions of amorphous semiconductor film 4 corresponding to a source and drain contact, which will be fabricated in the latter process [FIG. 6(c)].

By self-aligning, as can be seen from the above description, the area of amorphous semiconductor film 4 which was irradiated by the high energy beams 5 is polycrystallized by the annealing to be the polycrystalline semiconductor film 6.

As the high energy beams 5, XeCl excimer laser beams are applicable under desirable radiant energy varying from 100 to 250 mJ/cm$^2$. In the area of the polycrystalline semiconductor film 6 obtained under foregoing conditions, it is verified that electric conductivity is improved and photosensitivity is lowered.

Figure 6D:
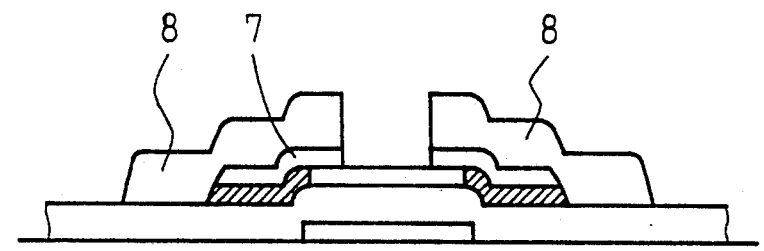

Then, the impurities introduced amorphous semiconductor film 7 composed of phosphorous introduced n+ a-Si is formed, on which the source electrode 8 and the drain electrode 8 are formed [FIG. 6(d)].

In this second embodiment, the impurities introduced amorphous semiconductor film 7 is formed after irradiating the high energy beams 5 as mentioned above, however, it may be done before the irradiation.

Figure 6E:
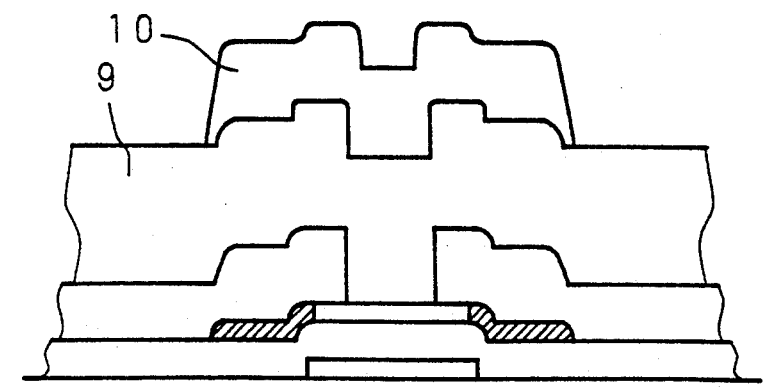

Finally, the passivation film 9 and the light shielding film 10 are laminated to complete the whole processes for manufacturing the TFT [FIG. 6(e)].

In the TFT obtained by the above-mentioned processes, the grain size of the polycrystalline semiconductor film (p-Si) 6 formed by the laser annealing varies from 100 Å to 5000 Å, and the ratio of conductivity under the light-irradiated state to the dark state $\sigma ph/\sigma d$ becomes less than double figures. It clearly shows that the electric conductivity is improved and the photosensitivity is lowered in comparison with the ratio of the area of non annealed amorphous semiconductor film (a-Si), which is more than five figures.

The TFT of the second embodiment has the properties that the ON/OFF ratio in the light shielded a-Si channel is larger while the other p-Si area outside the channel irradiated by the light beams is less affected by the light beams, by polycrystallizing only a part of the semiconductor film not shielded by the gate electrode 2 or light shielding film 10.

Figure 7:
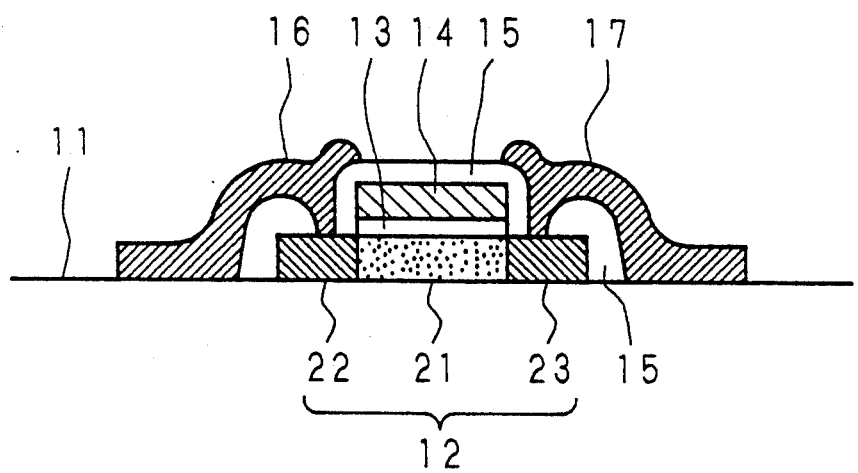
FIG. 7 is a sectional view illustrating construction of a further embodiment of the TFT of the present invention.

FIG. 7 is a sectional view illustrating construction of the TFT of the third embodiment of the present invention.

In this embodiment, the TFT is manufactured to laminate a semiconductor film 12 on an insulating substrate 11, and on a channel area 21 corresponding to a channel between a source electrode and a drain electrode on this semiconductor film 12 laminated a gate insulating film 13 and a gate electrode film 14 sequentially, while a source area 22 corresponding to the source electrode and a drain area 23 to the drain electrode on the semiconductor film 12 are brought in contact with a source electrode film 16 and a drain electrode film 17 sandwiching passivation films 15 as contact holes.

The TFT of the third embodiment is characterized in that the channel area 21 of the semiconductor film 12 is composed of either intrinsic or slightly P-type polysilicon [P-type p-Si] and both the source area 22 and the drain area 23 are composed of N-type polysilicon carbide [N-type p-SiC] and then the channel area 21 forms the hetero junction with both the source area 22 and the drain area 23.

Now will be described below the processes for manufacturing the TFT of the third embodiment with reference to FIG. 8.

Figure 8A:
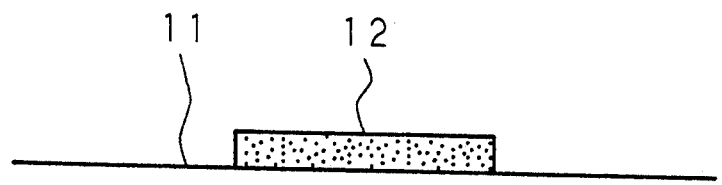
FIGS. 8(a)-8(f) are schematic views illustrating processes for manufacturing the TFT in FIG. 7.

As shown in FIG. 8(a), either intrinsic or slightly P-type p-Si is deposited on an alkali free glass substrate 11 with a thickness of 300 to 2000 Å, and this film is patterned like islands to become a semiconductor film 12. It is not intended that the deposition of the p-Si be limited to annealing an amorphous silicon [a-Si] with laser beams, solid phase crystallization may be employed.

Figure 8B:
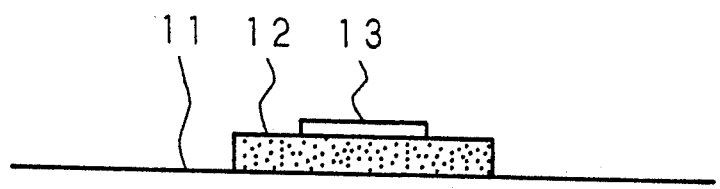

As shown in FIG. 8(b), on the area of the semiconductor film 12 which will be a channel in the latter process, is formed a gate insulating film 13 composed of SiNx or SiO$_2$ by atmospheric pressure CVD, low pressure CVD, ECR plasma CVD, plasma CVD or sputtering.

Figure 8C:
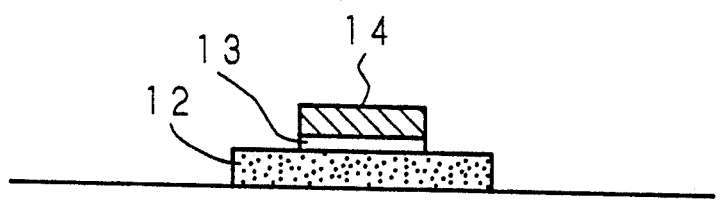

As shown in FIG. 8(c), on the gate insulating film 13 formed a gate electrode film 14 composed of p-Si film, which was doped with phosphorus under the temperature within 550 through 600 degrees centigrade. As for the gate electrode film 14, other metal material, such as Al or Ti, may be employed.

Figure 8D:
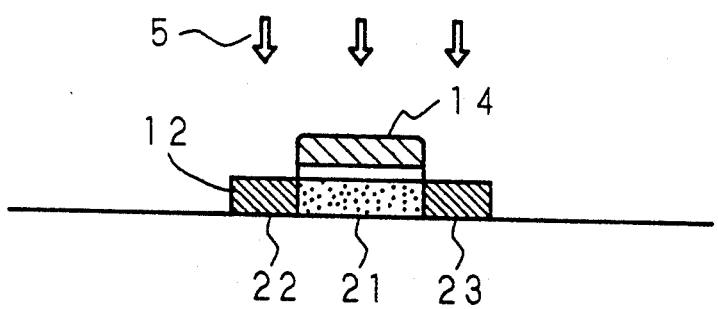

As shown in FIG. 8(d), the semiconductor film 12 is doped by laser doping [excimer laser: 50 through 900 mJ/cm$^2$; 1 through 100 pulse] where high energy beams 5 are irradiated on the semiconductor film 12 in the atmosphere of P (CH$_3$)$_3$ [5 torr] from the side of the gate electrode film 14 which works as a mask.

As a result, a source area 22 and a drain area 23 which are not masked by the gate electrode film 14 become N-type p-SiC. When the laser beams with radiant energy of 400 mJ/cm$^2$ (10 through 50 pulse) are irradiated on the source area 22 and the drain area 23, resistance per sheet of the both areas is 100Ω/□, and according to the measurement of the optical characteristics, that the energy gap Eg of these areas 22, 23 becomes wider, which verifies quality change to p-SiC.

Then, the source area 22 and drain area 23 composed of N-type p-SiC form the hetero junction with the channel area 21 of either intrinsic or slightly P-type p-Si.

The N channel TFT can be obtained in the above case, while in order to obtain a P channel TFT, laser doping for either intrinsic or slightly N-type semiconductor film 12 in the atmosphere of B (CH$_3$)$_3$ should be adapted.

Figure 8E:
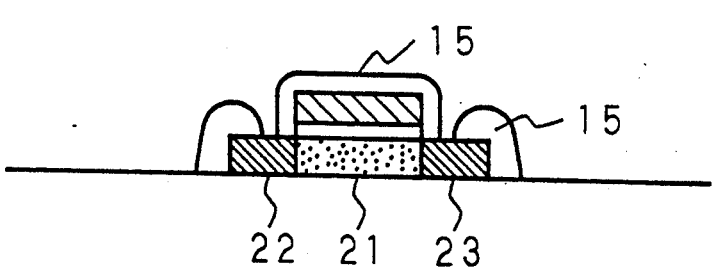

As shown in FIG. 8(e), the passivation film 15 composed of SiNx or SiO$_2$ is deposited to form contact holes respectively in the source area 22 and drain area 23 of the semiconductor film.

Figure 8F:
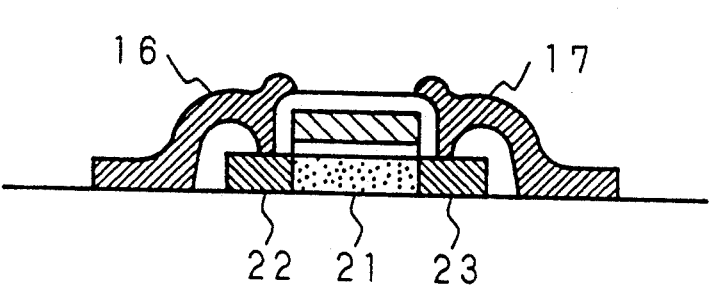

In the final process, as shown in FIG. 8(f), on the passivation film 15 are deposited metal sheets for wiring, such as Al, Al-Si which will be the source electrode film 16 and the drain electrode film 17.

The OFF-state current of the N channel TFT with a channel width of 20 μm and a channel length of 5 μm is $2 \times 10^{-12}$ A, which is lesser by double figures in comparison with that of the conventional TFT without the hetero junction.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A thin film transistor comprising:
   a gate electrode film;
   a gate insulating film which covers and insulates said gate electrode film;
   a source and drain electrode film;
   a polycrystalline semiconductor film provided between said gate insulating film and said source and drain electrode film, said semiconductor film having a source area and a drain area and defining a channel between said source area and said drain area, said semiconductor film further comprising a hetero-junction between the channel and said source and drain areas, said source and drain areas each being composed of polysilicon carbide, said channel being composed of polysilicon.

2. A thin film transistor as set forth in claim 1, wherein said channel is intrinsic poly-silicon and said source area and drain area are each N-type polysilicon carbide.

3. A thin film transistor as set forth in claim 1, wherein said channel is P-type polysilicon and said source area and drain area are each N-type polysilicon carbide.

* * * * *